United States Patent
Tanaka et al.

(10) Patent No.: US 9,261,548 B2
(45) Date of Patent: Feb. 16, 2016

(54) HUM NOISE DETECTION DEVICE

(75) Inventors: Masakiyo Tanaka, Kawasaki (JP); Shusaku Ito, Fukuoka (JP)

(73) Assignee: FUJITSU LIMITED, Kawasaki (JP)

(*) Notice: Subject to any disclaimer, the term of this patent is extended or adjusted under 35 U.S.C. 154(b) by 549 days.

(21) Appl. No.: 13/605,487

(22) Filed: Sep. 6, 2012

(65) Prior Publication Data
US 2013/0058489 A1    Mar. 7, 2013

Related U.S. Application Data

(63) Continuation of application No. PCT/JP2010/001718, filed on Mar. 10, 2010.

(51) Int. Cl.
| | |
|---|---|
| H04B 15/00 | (2006.01) |
| G01R 31/00 | (2006.01) |
| H04B 17/345 | (2015.01) |
| G01R 19/25 | (2006.01) |
| G01R 29/26 | (2006.01) |
| G01R 31/42 | (2006.01) |

(52) U.S. Cl.
CPC ............ *G01R 31/001* (2013.01); *H04B 17/345* (2015.01); *G01R 19/2513* (2013.01); *G01R 29/26* (2013.01); *G01R 31/42* (2013.01)

(58) Field of Classification Search
CPC ................. H04N 15/005; H04N 15/00; G10L 2021/02085
USPC ................................... 381/94.6; 704/E21.005
See application file for complete search history.

(56) References Cited

U.S. PATENT DOCUMENTS

| | | | |
|---|---|---|---|
| 6,476,308 B1 * | 11/2002 | Zhang ............................ | 84/616 |
| 2002/0123308 A1 * | 9/2002 | Feltstrom ........................ | 455/63 |
| 2004/0165736 A1 * | 8/2004 | Hetherington et al. ...... | 381/94.3 |
| 2006/0195500 A1 | 8/2006 | Joublin et al. | |

FOREIGN PATENT DOCUMENTS

| | | |
|---|---|---|
| JP | 2004-157202 | 6/2004 |
| JP | 2005-77423 | 3/2005 |
| JP | 2006-209123 | 8/2006 |

(Continued)

OTHER PUBLICATIONS

English translation of International Preliminary Report on Patentability mailed Oct. 2, 2012 for corresponding International Application No. PCT/JP2010/001718.
International Search Report of PCT/JP2010/001718 mailed May 25, 2010.
Office Action mailed Jan. 7, 2014 in corresponding Japanese Application No. 2012-504147.

(Continued)

*Primary Examiner* — Joseph Saunders, Jr.
*Assistant Examiner* — James Mooney
(74) *Attorney, Agent, or Firm* — Staas & Halsey LLP

(57) ABSTRACT

A hum noise detection device includes: a frequency conversion unit (1) configured to perform a frequency converting process at a constant time interval on an input signal, and converting the input signal into a frequency signal; a peak frequency calculation unit (2) configured to calculate a stationary peak frequency based on the frequency signal; a fundamental frequency estimation unit (3) configured to estimate a fundamental frequency of hum noise based on the stationary peak frequency; and a hum noise judgment unit (4) configured to judge whether or not there is hum noise in the input signal based on the estimated fundamental frequency and the stationary peak frequency.

15 Claims, 10 Drawing Sheets

(56) References Cited

FOREIGN PATENT DOCUMENTS

| | | |
|---|---|---|
| JP | 2008-199176 | 8/2008 |
| JP | 2009-195571 | 9/2009 |

OTHER PUBLICATIONS

Extended European Search Report for Appln. No. 10847338.0 dated Oct. 8, 2015.

* cited by examiner

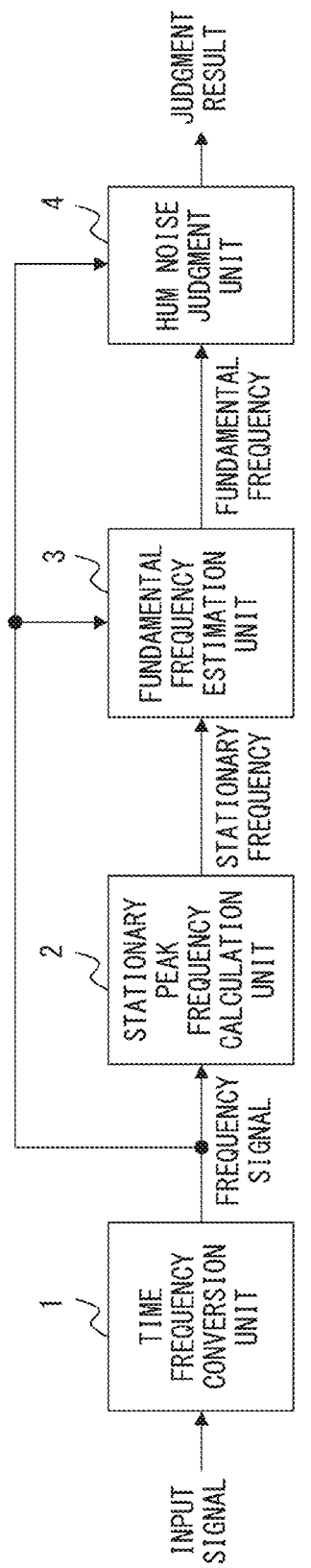
F I G. 1

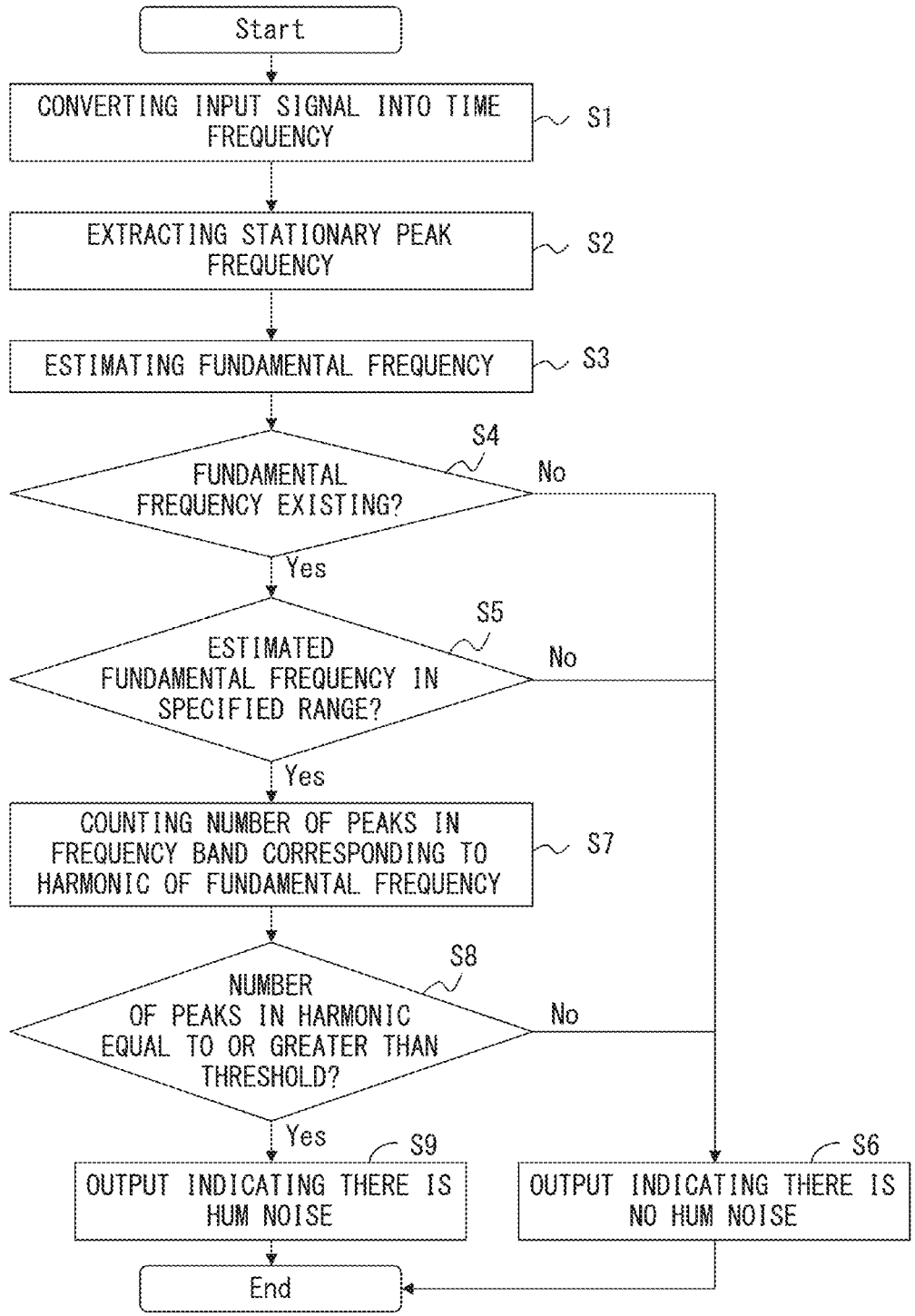
F I G. 2

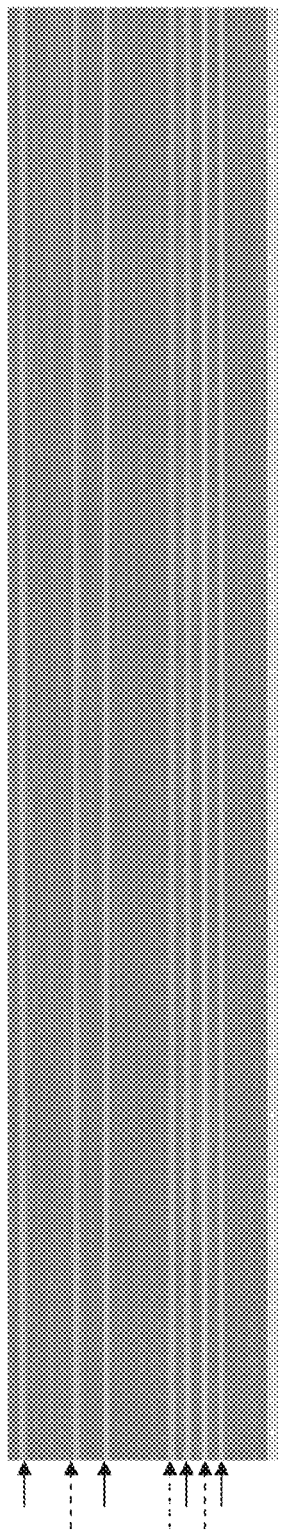
F I G. 7

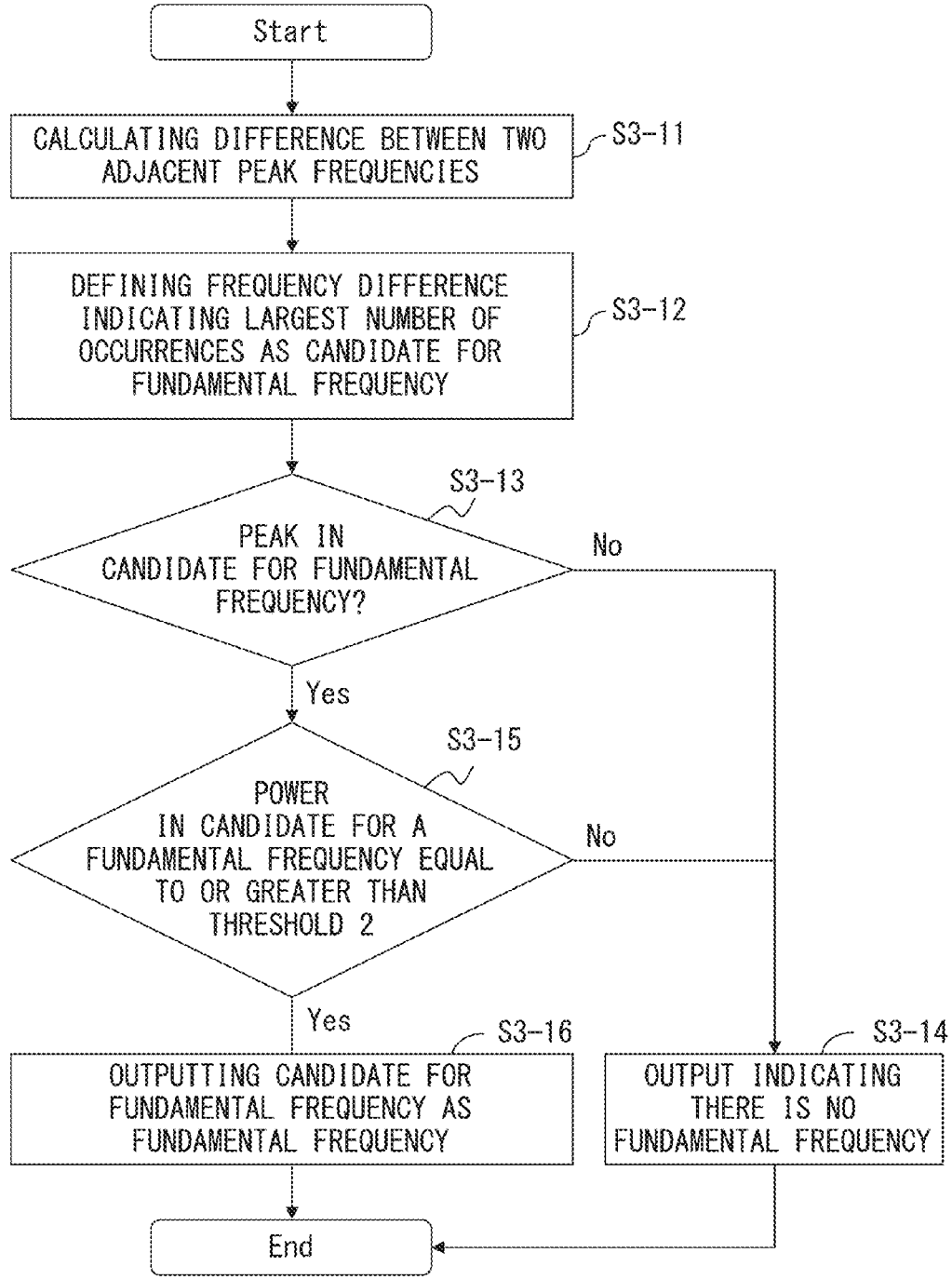
F I G. 8

HUM NOISE DETECTION DEVICE

CROSS-REFERENCE TO RELATED APPLICATIONS

This application is a continuation application of International Application PCT/JP2010/001718 filed on Mar. 10, 2010 and designated the U.S., the entire contents of which are incorporated herein by reference.

FIELD

The present invention relates to digital audio signal processing, and more specifically to a hum noise detection device for detecting hum noise caused by electromagnetic wave etc. generated from an AC power supply.

BACKGROUND

Hum noise caused by an electromagnetic wave etc. generated as harsh noise in an AC power supply is known. The hum noise is caused by an electromagnetic wave generated by an amplitude such as an AC power supply etc., and is composed of waves having a fundamental frequency having power substantially constant in time and a plurality of harmonic components. The hum noise is caused by a trouble in a circuit of an amplifier, an A/D (analog-to-digital) converter, a D/A (digital-to-analog) converter, etc. For example, when the insulation between the circuit and the power circuit is insufficient, the AC component of 50 Hz and 60 Hz as the frequency of commercial power incidentally influences a signal line, thereby causing the hum noise.

To remove the hum noise, there is a noise removal device proposed for removing noise by, for example, selecting and composing the spectrum relating to the noise frequency from the spectrum data of an audio signal converted into a frequency area segmented for each frame, and the amplitude data of each spectrum, and subtracting the composed noise waveform from an audio waveform, thereby removing noise.

However, a conventional device is not capable of detecting noise other than that having a specified frequency. For example, when the frequency of a clock signal provided for an A/D converter is shifted due to the trouble of a crystal oscillator and a frequency dividing circuit, the frequency of hum noise to be detected is also shifted, and is not allowed to correctly detect the hum noise.

When there is a stationary frequency component such as a chord etc., and if the stationary frequency component incidentally is fallen into a specified band for removing hum noise, then it may be misdetected as hum noise.

Furthermore, for example, the passband of a phone voice is 300 Hz through 3400 Hz, the power of the fundamental frequency band of the hum noise of 50 Hz through 60 Hz is attenuated, and the fundamental frequency of the hum noise may not correctly detected in the existing fundamental frequency estimating method using an auto-correlation etc.

SUMMARY

According to an aspect of the embodiments, a hum noise detection device includes: a frequency conversion unit that performs a frequency converting process at a specific time interval on an input signal of telephone voice etc. to convert the input signal into a frequency signal; a stationary peak frequency calculation unit that has power substantially constant in time according to the frequency signal and calculates stationary peak frequencies at which the power reach peaks; a fundamental frequency estimation unit that calculates a greatest common divisor of the stationary peak frequencies or calculates a frequency interval of the stationary peak frequencies, and estimates a fundamental frequency of hum noise included in the frequency signal; and a hum noise judgment unit that judges whether or not there is hum noise in the input signal according to an estimated fundamental frequency and the stationary peak frequencies.

The object and advantages of the invention will be realized and attained by means of the elements and combinations particularly pointed out in the claims.

It is to be understood that both the foregoing general description and the following detailed description are exemplary and explanatory and are not restricted of the invention, as claimed.

BRIEF DESCRIPTION OF DRAWINGS

FIG. 1 is a block diagram of the system of the hum noise detection device according to an embodiment of the present invention;

FIG. 2 is a flowchart for explanation of the process according to an embodiment of the present invention;

FIG. 7 illustrates the relationship between the fundamental frequency and a harmonic using a chord etc.;

FIG. 8 is a flowchart for explanation of a process of estimating a fundamental frequency by calculating a difference;

DESCRIPTION OF EMBODIMENTS

The embodiments of the present invention are described below with reference to the attached drawings.

FIG. 1 is a block diagram of the system of the hum noise detection device according to an embodiment of the present invention.

In FIG. 1, the hum noise detection device is composed of a time frequency conversion unit 1, a stationary peak frequency calculation unit 2, a fundamental frequency estimation unit 3, and a hum noise judgment unit 4. The time frequency conversion unit 1 performs sampling on an input signal at a constant time interval, and converts the signal into a frequency signal. The stationary peak frequency calculation unit 2 calculates the frequencies stationarily corresponding to peaks in the frequency signal. The fundamental frequency estimation unit 3 estimates a fundamental frequency of hum noise. The hum noise judgment unit 4 judges about the hum noise based on the fundamental frequency.

The process of estimating the fundamental frequency of hum noise by the fundamental frequency estimation unit 3 uses a method of estimating a fundamental frequency from the value as a greatest common divisor of a stationary frequencies, and a method of estimating a fundamental frequency from the interval of the stationary frequencies as the peaks. The process of estimating each fundamental frequency is described later.

FIG. 2 is a flowchart for explanation of the process according to an embodiment of the present invention. First, the time frequency conversion unit 1 performs sampling on an input signal at a constant time interval, and converts the signal into a frequency signal by a Fourier transform (step (hereafter expressed as S) 1). The input signal input to the time frequency conversion unit 1 is an audio signal input to terminal equipment such as a telephone unit etc. through, for example, a communication network.

Figure 3:
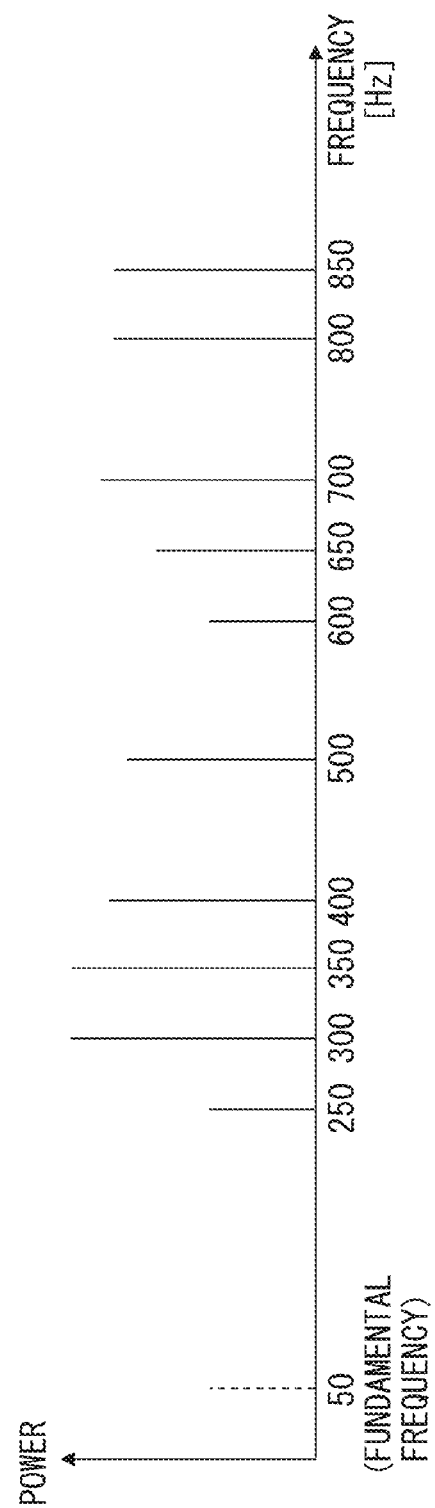
FIG. 3 is an example of a stationary peak frequency.

Next, stationary peak frequencies as stationary peaks is extracted from a frequency signal (S2). FIG. 3 is an example of stationary peak frequencies extracted by the stationary peak frequency calculation unit 2. In the example, there are the stationary peak frequencies at the frequencies 250 Hz, 300 Hz, 350 Hz, 400 Hz, 500 Hz, 600 Hz, 650 Hz, 700 Hz, 800 Hz, and 850 Hz.

Next, the fundamental frequency estimation unit 3 estimates a fundamental frequency using the stationary peak frequencies (S3). For example, in FIG. 3, the frequency as the greatest common divisor of the stationary peak frequencies is estimated as a fundamental frequency. In this case, the stationary peak frequencies are each frequency described above, and the fundamental frequency is estimated based on the stationary peak frequencies. Practically, a frequency corresponding to the power that exceeds a threshold is extracted from the stationary peak frequencies, and the frequency as the greatest common divisor of the extracted stationary peak frequency is defined as a fundamental frequency.

The hum noise detection device can be provided. The hum noise detection device may be capable of detecting hum noise even when the hum noise component is shifted to the band other than the intrinsic frequency due to a trouble of a circuit, etc. and also be capable of detecting the fundamental frequency of hum noise correctly without misdetecting the hum noise even when a signal having a plurality of peak frequencies such as a chord is inputted.

Figure 4:
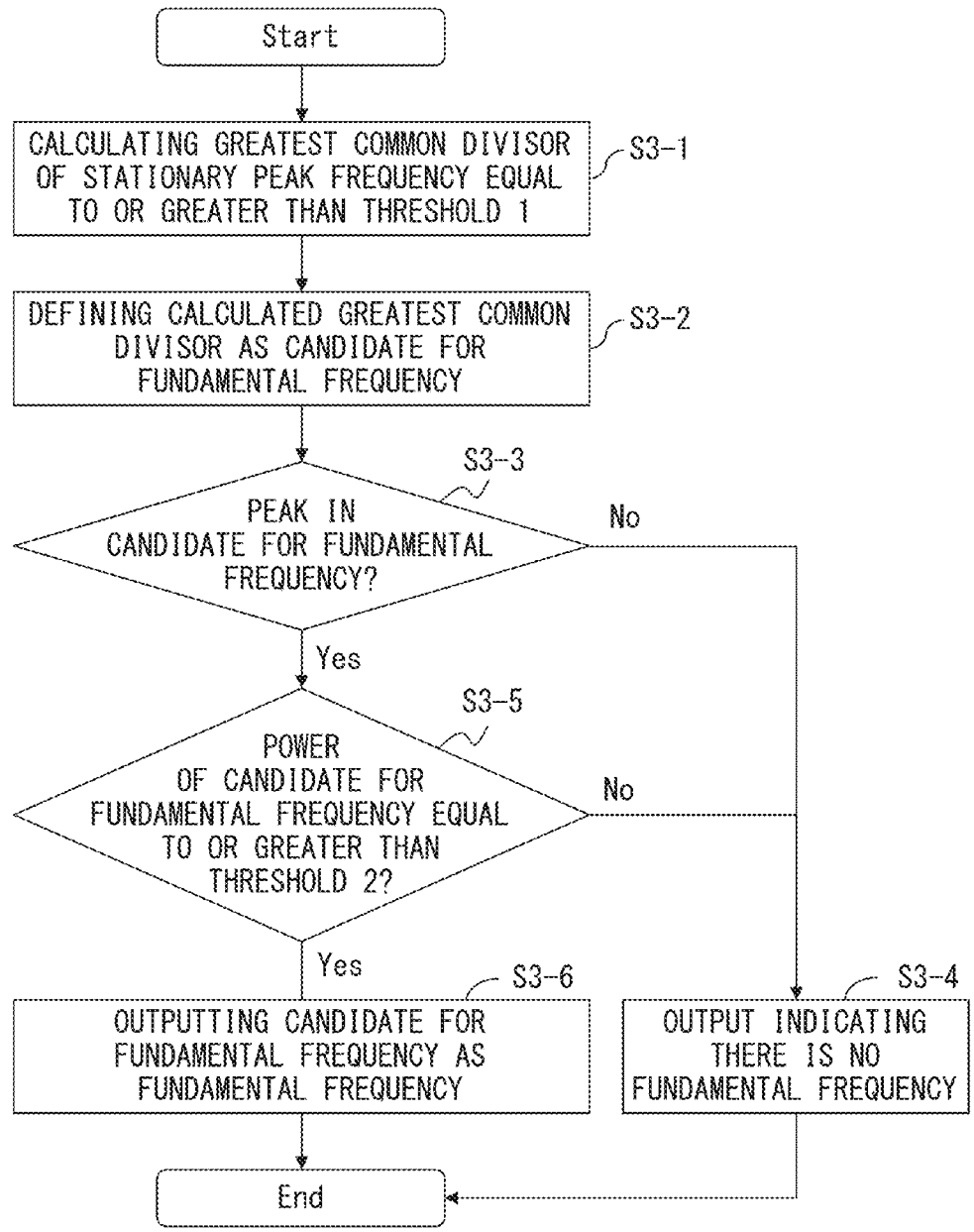
FIG. 4 is a flowchart for explanation of the process of estimating a fundamental frequency by calculating a greatest common measure.
Figure 5:
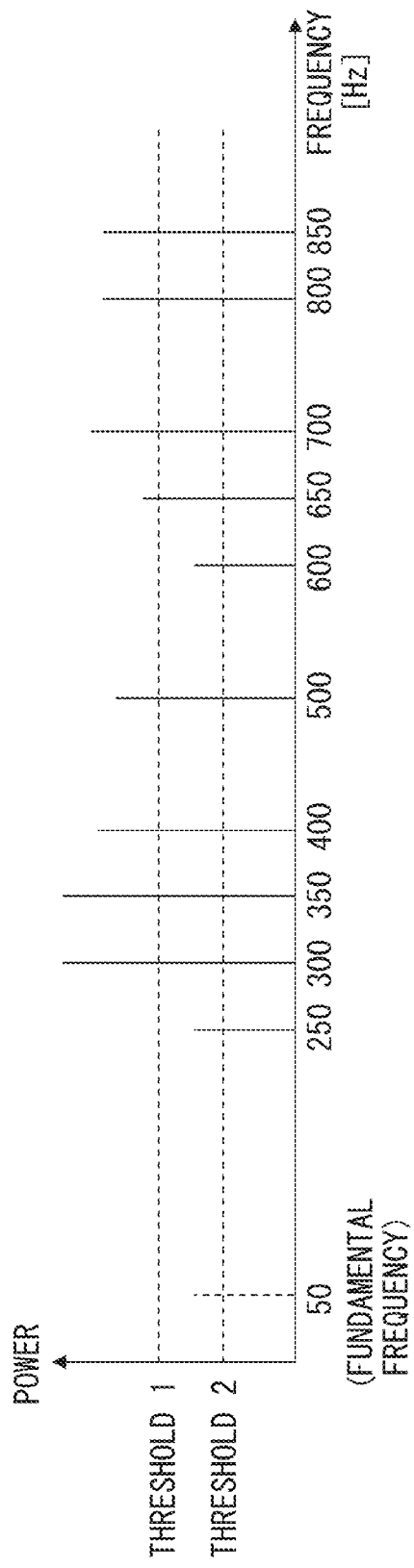
FIG. 5 is an example of a stationary peak frequency which has exceeded a threshold.

FIG. 4 is a flowchart for explanation of the process of estimating a fundamental frequency. First, the stationary peak frequencies corresponding to the power that exceed a threshold 1 are extracted, and the greatest common divisor of the extracted stationary peak frequencies is calculated (S3-1). For example, in the example illustrated in FIG. 3 above, there are eight peak frequencies corresponding to the power that exceeds the threshold 1. That is, as illustrated in FIG. 5, the stationary peak frequencies are 300 Hz, 350 Hz, 400 Hz, 500 Hz, 650 Hz, 700 Hz, 800 Hz, and 850 Hz.

Next, the greatest common divisor of the stationary peak frequencies corresponding to the power that exceeds the threshold 1 are defined as candidates for a fundamental frequency (S3-2), and judges whether or not there is a peak among the candidates for a fundamental frequency (S3-3). Unless there is a peak among the candidates for the fundamental frequency (NO in S3-3), an output indicating there is no fundamental frequency is made (S3-4). On the other hand, if there is a peak among the candidates for the fundamental frequency (YES in S3-3), it is further judged whether or not the power of the candidates for a fundamental frequency is equal to or exceeds a threshold 2 (S3-5). For example, in the example illustrated in FIG. 5, the candidates for a fundamental frequency as the greatest common divisor of the eight stationary peak frequencies is 50 Hz, and the peak exists at 50 Hz as illustrated in FIG. 5. Therefore, a judgment is further performed (S3-5)

The judgment (S3-5) determines about the power of candidates for a fundamental frequency because it is not determined that there is noise unless the peak value is equal to or exceeds specified power although there is a peak value among the candidates for a fundamental frequency. The threshold 2 is a value set from practical measured data etc., and the threshold 2 is the power of 50% with respect to the threshold 1 in the explanation according to the present embodiment.

Therefore, unless the power of the candidates for a fundamental frequency is equal to or exceeds the threshold 2 (NO in S3-5), an output indicating there is no fundamental frequency is made (S3-4). On the other hand, if the candidate for a fundamental frequency corresponds to the power equal to or exceeding the threshold 2 (YES in S3-5), the candidate for a fundamental frequency is outputted as a fundamental frequency (S3-5). For example, in the example in FIG. 5, the candidate for a fundamental frequency is 50 Hz, and the power at 50 Hz exceeds the threshold 2, thereby outputting the candidate for a fundamental frequency as the fundamental frequency.

Next, back to the explanation of the flowchart illustrated in FIG. 2, after confirming the determination of the determination is "YES" (S4), control proceeds to the next determination (S5). If it is determined that no fundamental frequency exists according to the process described referring to the flowchart illustrated in FIG. 4, the result of the determination (S4) in FIG. 2 is also NO, thereby making an output indicating there is no fundamental frequency (S6).

The next determination (S5) is to determine whether or not the estimated fundamental frequency is in a specified range. The determination is carried out to detect noise even when the frequency of hum noise is shifted, for example, due to clock shift, and determining the noise as hum noise if the fundamental frequency exists in a specified frequency range.

Figure 6:
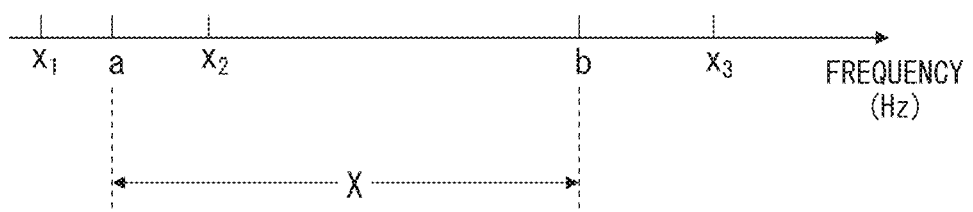
FIG. 6 is an explanatory view of the range of the shift width for a fundamental frequency.

FIG. 6 is an explanatory view of the determination process. If the fundamental frequency X is fallen into a range from aHz to bHz, that is, $a \leq X \leq b$, then the fundamental frequency X is estimated as hum noise. In the example illustrated in FIG. 6, X1, X2, and X3 are detected as fundamental frequencies. In this case, the fundamental frequency X2 satisfies the above mentioned condition, $a \leq X2 \leq b$ (YES in S5). However, the fundamental frequencies X1 and X3 do not satisfy the condition above (NO in S5), and an output indicating there is no fundamental frequency is made (S6). If the fundamental frequency is fallen into a range from 50 Hz to 60 Hz, the value of a is, for example, 45 (45 Hz) and the value of b is, for example, 65 (65 Hz). It is obvious that the values are not limited to those described above.

Next, when the result of the determination above (S5) is YES, the number of peaks is counted in the frequency band corresponding to the harmonics of the fundamental frequency (S7), and it is determined whether or not the number of peaks with the harmonic is equal to or greater than a threshold (S8) The determination is made in order to prevent misjudgment about a fundamental frequency from occurring although a stationary sound such as a chord etc. having two or more frequencies is input. The example illustrated in FIG. 7 is an example of a frequency spectrum of a chord included in a music-on-hold, and includes a fundamental frequency 1 and its harmonic component indicated by solid arrows, and a fundamental frequency 2 and its harmonic component indicated by dotted arrows.

In this case, unless the number of peaks for harmonics is less than a threshold (NO in S8), an output indicating there is no hum noise is made (S6). On the other hand, if the number of peaks for the harmonic is equal to or greater than a threshold (YES in S8), an output indicating there is a hum noise is made (S9). In this process, even when a chord or the like is included in the input signal, a non-hum-noise component is prevented from being misdetected as a hum noise component.

As described above, according to the hum noise detection device of the present embodiment, a hum noise component is detected even when it is not composed of a component other than a preset frequency, and hum noise is correctly detected even when the frequency of the hum noise is shifted by a clock shift etc. In addition, a non-hum-noise component is prevented from being mis-detected as a hum noise component.

Furthermore, in the explanation of the embodiments above, in the fundamental frequency estimating process (S3), the greatest common divisor of the stationary peak frequencies is calculated according to the flowchart in FIG. 4, but a fundamental frequency is also estimated also according to the flowchart illustrated in FIG. 8.

Figure 9:
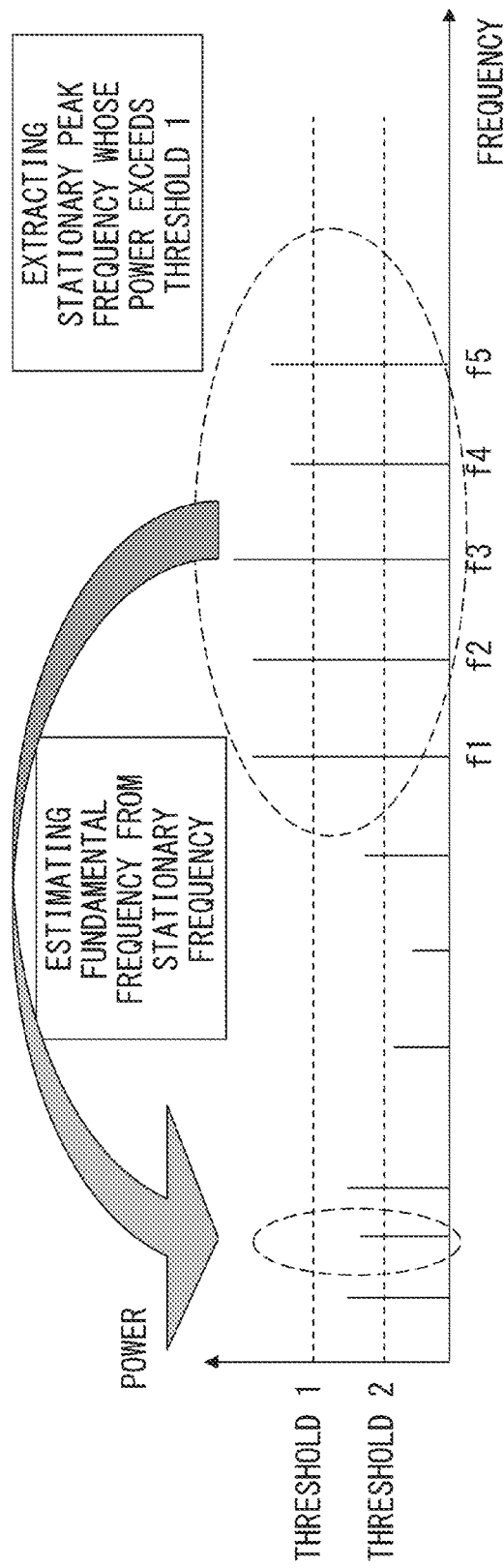
FIG. 9 is an explanatory view of a process of estimating a fundamental frequency by calculating a difference.

Practically, when the stationary peak frequencies as illustrated in FIG. 9 is acquired, a stationary peak frequencies exceeding the threshold 1 is extracted as described above, and a difference between two adjacent stationary peak frequencies is calculated (S3-11). For example, in the example illustrated in FIG. 9, the difference between the peak frequencies f1 and f2 exceeding the threshold 1 is calculated, and the differences between the peak frequencies f2 and f3, f3 and f4, and f4 and f5 that exceed the threshold 1 are sequentially calculated.

Next, the difference having the largest number of occurrences is selected as a candidate for a fundamental frequency from among the calculated pieces of difference data (S3-12). Then, it is determined whether or not there is a peak in the calculated candidate for the fundamental frequency (S3-13). If there is not a peak in the candidate for the fundamental frequency (NO in S3-13), an output indicating there is no fundamental frequency is made (S3-14). On the other hand, for example, if there is a peak in the candidate for the fundamental frequency as illustrated in FIG. 9 (YES in S3-13), it is further determined whether or not the power of the candidate for the fundamental frequency is equal to or greater than a threshold 2 (S3-15).

In this determination, as described above, the existence of noise is not determined unless the peak value is equal to or exceeds specified power when there is a peak value in the candidate for the fundamental frequency, and it is determined whether or not the power of the candidate for the fundamental frequency is equal to or greater than the threshold 2. When the power of the candidate for the fundamental frequency is less than the threshold 2 (NO in S3-15), an output indicating there is no fundamental frequency is made (S3-14). On the other hand, if the peak value of the candidate for the fundamental frequency is equal to or exceeds 2 (YES in S3-15), the candidate for a fundamental frequency is outputted as a fundamental frequency (S3-16).

As just described above, by extracting the fundamental frequency, hum noise can be detected surely as in the previous examples.

Figure 10:
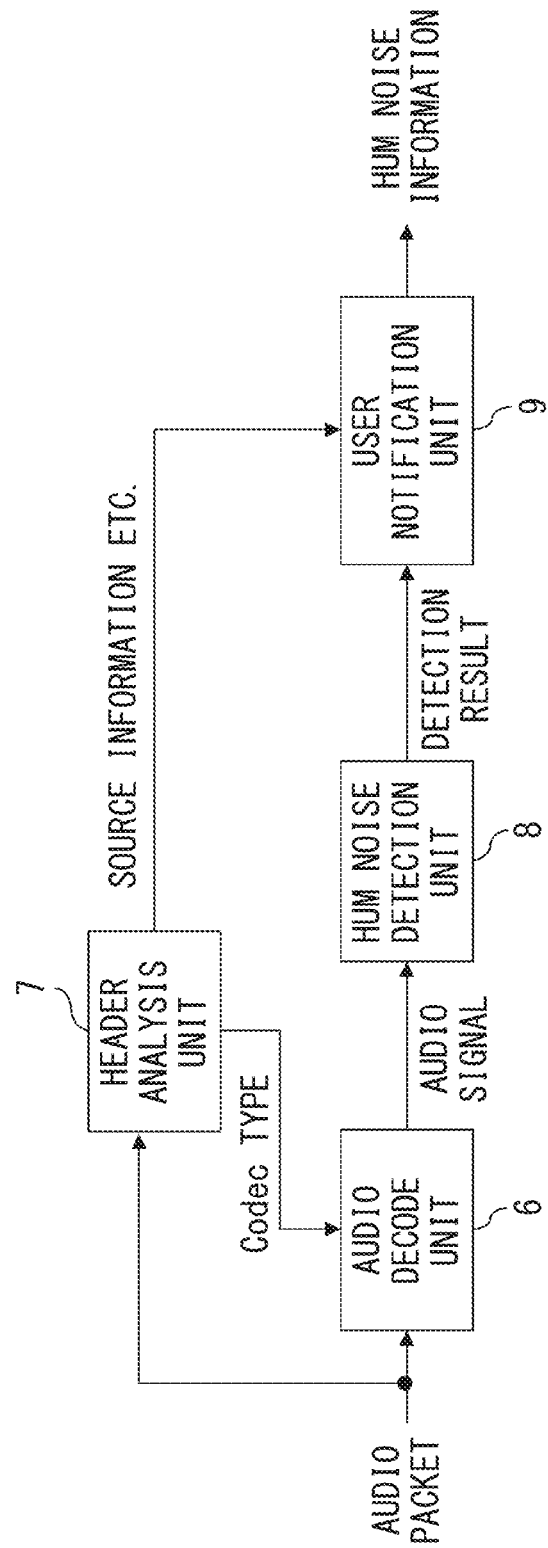
FIG. 10 is an example of applying the hum noise detection device according to an embodiment of the present invention to a VoIP sound quality management system.

FIG. 10 is a block diagram of a system in which the hum noise detection device according to embodiments of the present invention is applied to a VoIP (voice over IP) sound quality management system. The VoIP sound quality management system manages sound quality in voice communications utilizing a network in which an IP connection is used. Although, in the system illustrated in FIG. 10, hum noise is detected only, various detecting processes relating to audio quality such as the detection of noise other than hum noise, echo detection, measurement of a packet delay time, a measurement of a packet loss, etc. can be simultaneously performed.

The present system is configured by an audio decode unit 6, a header analysis unit 7, a hum noise detection unit 8, and a user notification unit 9. For example, audio data packet is received over a network, and provided for the audio decode unit 6 and the header analysis unit 7. The header analysis unit 7 analyzes the header information included in the audio packet, and acquires the information such as the type of audio Codec (conversion), a source IP address, etc.

The audio decode unit 6 decodes audio data from an audio packet depending on the type of the audio Codec analyzed by the header analysis unit 7. In addition, the hum noise detection unit 8 detects the hum noise included in the audio data decoded by the audio decode unit 6. The detection of the hum noise is performed based on the process described above with reference to the embodiments above.

Then, based on the detection result of the hum noise by the hum noise detection unit 8, the user notification unit 9 notifies a user of the presence/absence of hum noise, the position information about the hum noise, etc. when the hum noise is detected. In this case, a notification is issued to the source, the destination, the system administrator, etc. of the audio packet using the destination IP address analyzed by the header analysis unit 7 and the source IP address.

By performing the processes above, hum noise can be detected surely although the hum noise is incidentally included in the decoded audio data is detected, the hum noise detected by a well-known hum noise removing method can be removed, and the audio data can be transmitted to a destination etc. with the hum noise removed.

When the power of a candidate for a fundamental frequency is a maximum value in the frequency signals in the above-mentioned process of estimating a fundamental frequency from a candidate for a fundamental frequency, the candidate for a fundamental frequency is determined as a fundamental frequency. In addition, if the power in the candidate for a fundamental frequency is equal to or exceeds a specified hardware, and the power indicates a maximum value, the candidate for a fundamental frequency is determined as a fundamental frequency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A hum noise detection device, comprising:
a frequency conversion unit configured to perform a frequency converting process on an input signal, and to convert the input signal into a frequency signal;
a peak frequency calculation unit configured to calculate a peak frequency based on the frequency signal;
a fundamental frequency estimation unit configured to estimate a fundamental frequency based on the peak frequency and the frequency signal; and
a hum noise judgment unit configured to judge that the input signal includes hum noise when a number of peaks in a frequency band corresponding to harmonics of the fundamental frequency is equal to or greater than a specified threshold.

2. The device according to claim 1, wherein the peak frequency calculation unit outputs a peak frequency only when a peak is stationary.

3. The device according to claim 2, wherein the fundamental frequency estimation unit obtains a candidate for the fundamental frequency based on the stationary peak frequency, determines whether or not the candidate for the fundamental frequency is the fundamental frequency, outputs the candidate for the fundamental frequency as the fundamental frequency when the candidate is determined as the fundamental frequency, and discards the candidate for the fundamental frequency when the candidate is not determined as the fundamental frequency.

4. The device according to claim 3, wherein a greatest common divisor of the stationary peak frequency is defined as the candidate for the fundamental frequency.

5. The device according to claim 3, wherein an interval of the stationary peak frequencies is calculated, and a frequency interval indicating a largest number of occurrences is defined as the candidate for the fundamental frequency.

6. The device according to claim 3, wherein when power of the candidate for the fundamental frequency is equal to or exceeds a specified threshold, the candidate for the fundamental frequency is defined as the fundamental frequency.

7. The device according to claim 3, wherein when power of the candidate for the fundamental frequency is a maximum value, the candidate for the fundamental frequency is defined as the fundamental frequency.

8. The device according to claim 3, wherein when power of the candidate for the fundamental frequency is equal to or greater than a specified threshold and the power refers to a maximum value, the candidate for the fundamental frequency is defined as the fundamental frequency.

9. The device according to claim 2, wherein the hum noise judgment unit judges hum noise when the fundamental frequency ranges in a specified frequency band and a number of harmonic components of the fundamental frequency is equal to or greater than a specified threshold.

10. A hum noise detecting method comprising:
performing a frequency converting process on an input signal, and converting the input signal into a frequency signal;
calculating a peak frequency according to the frequency signal;
estimating a fundamental frequency based on the peak frequency and the frequency signal; and
judging that the input signal includes hum noise when a number of peaks in a frequency band corresponding to harmonics of the fundamental frequency is equal to or greater than a specified threshold.

11. The method according to claim 10, wherein in the calculating the peak frequency, a peak frequency is outputted only when a peak is stationary.

12. The method according to claim 11, wherein the estimating the fundamental frequency further includes:
obtaining a candidate for a fundamental frequency based on the stationary peak frequency;
determining whether or not the candidate for a fundamental frequency is the fundamental frequency;
outputting the candidate for a fundamental frequency as the fundamental frequency when the candidate is determined as the fundamental frequency; and
discarding the candidate for a fundamental frequency when the candidate is not determined as the fundamental frequency.

13. The method according to claim 12, wherein a greatest common divisor of the peak frequency is defined as the candidate for the fundamental frequency.

14. The method according to claim 12, wherein an interval of the peak frequency is calculated, and a frequency interval indicating a largest number of occurrences is defined as the candidate for a fundamental frequency.

15. The method according to claim 11, wherein in the judging whether or not there is hum noise, it is judge that there is hum noise when the fundamental frequency ranges in a specified frequency band and a number of harmonic components of the fundamental frequency is equal to or exceeds a specified threshold.

* * * * *